United States Patent [19]

Germer et al.

[11] Patent Number: 5,017,860

[45] Date of Patent: May 21, 1991

[54] ELECTRONIC METER DIGITAL PHASE COMPENSATION

[75] Inventors: Warren R. Germer, Dover, N.H.; Maurice J. Ouellette, North Berwick, Me.; Mehrdad Negahban-Hagh, Irvine, Calif.

[73] Assignee: General Electric Company, Somersworth, N.H.

[21] Appl. No.: 542,668

[22] Filed: Jun. 25, 1990

Related U.S. Application Data

[63] Continuation of Ser. No. 279,178, Dec. 2, 1988, abandoned.

[51] Int. Cl.$^5$ .................... G01R 21/00; G01R 35/04
[52] U.S. Cl. .................................. 324/142; 324/107; 324/141; 324/74; 364/487
[58] Field of Search ............. 324/107, 141, 142, 77 R, 324/83 D, 74; 364/483, 487; 73/660

[56] References Cited

U.S. PATENT DOCUMENTS

| | | | |
|---|---|---|---|
| 4,300,182 | 11/1981 | Schweitzer, III | 324/141 |
| 4,356,446 | 10/1982 | Battocletti | 324/142 |
| 4,408,283 | 10/1983 | Kovalchik et al. | 324/142 |
| 4,535,287 | 8/1985 | Milkovic | 324/107 |
| 4,556,843 | 12/1985 | Milkovic et al. | 324/142 |
| 4,559,492 | 12/1985 | Baba et al. | 324/83 D |
| 4,682,102 | 7/1987 | Milkovic | 324/107 |
| 4,761,605 | 8/1988 | Jochum | 324/142 |
| 4,794,369 | 12/1988 | Haferd | 324/141 |
| 4,795,974 | 1/1989 | Landman et al. | 364/483 |
| 4,839,819 | 6/1989 | Begin et al. | 324/142 |

Primary Examiner—Kenneth Wieder
Assistant Examiner—William J. Burns
Attorney, Agent, or Firm—Robert E. Brunson; Irving M. Freedman

[57] ABSTRACT

An electronic watthour meter for metering the consumption of electrical energy on power lines includes phase compensation means for compensating for leading and lagging phase differences between line current and voltage, whereby sampling times of the current and voltage are shifted to compensate for phase errors between the current and voltage by controlling timing signals provided to current and voltage analog to digital converters. Digital output signals from the analog to digital converters proportional to current and voltage are multiplied to provide an accurate representation of energy consumption as a result of the compensation.

25 Claims, 4 Drawing Sheets

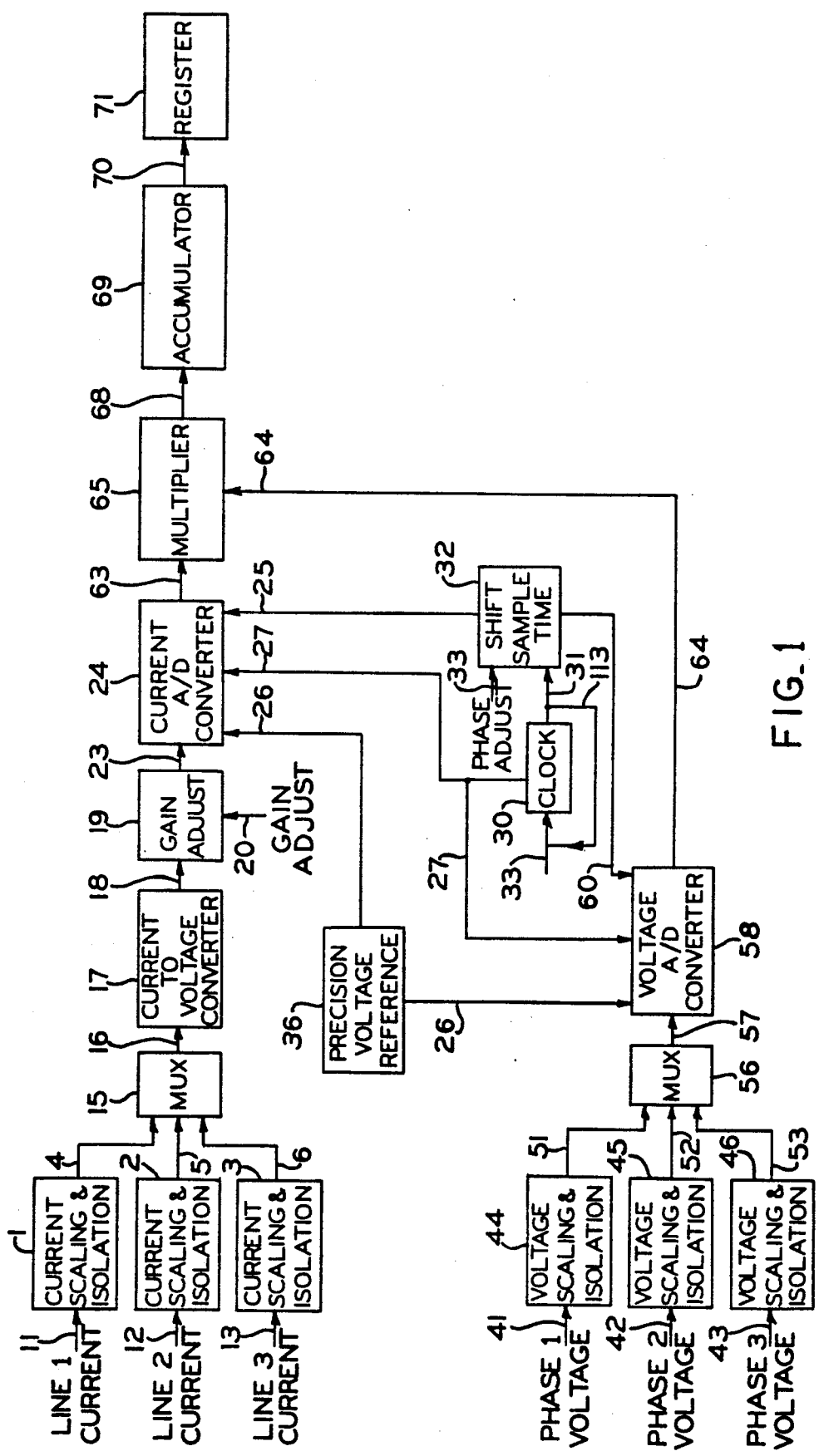
FIG_1

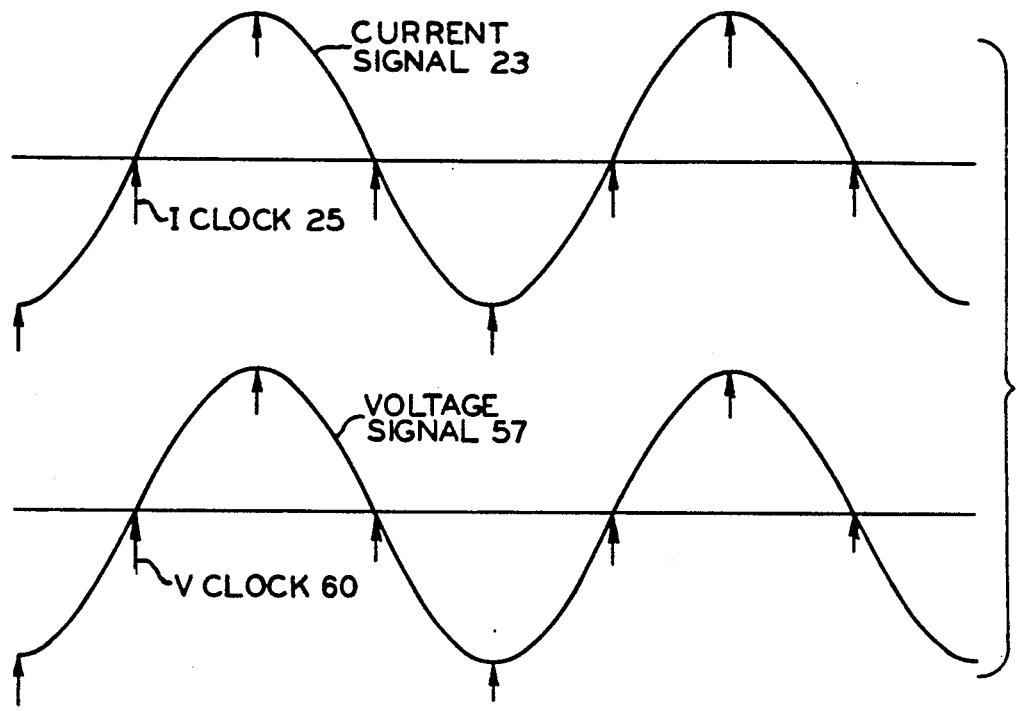
FIG_2
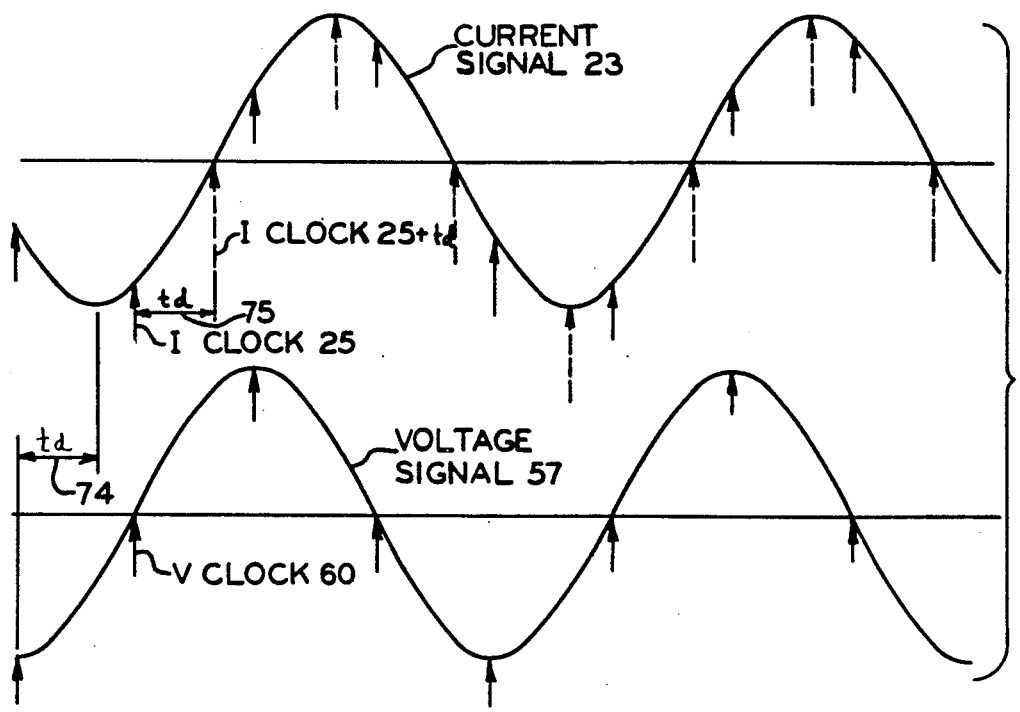
FIG_3

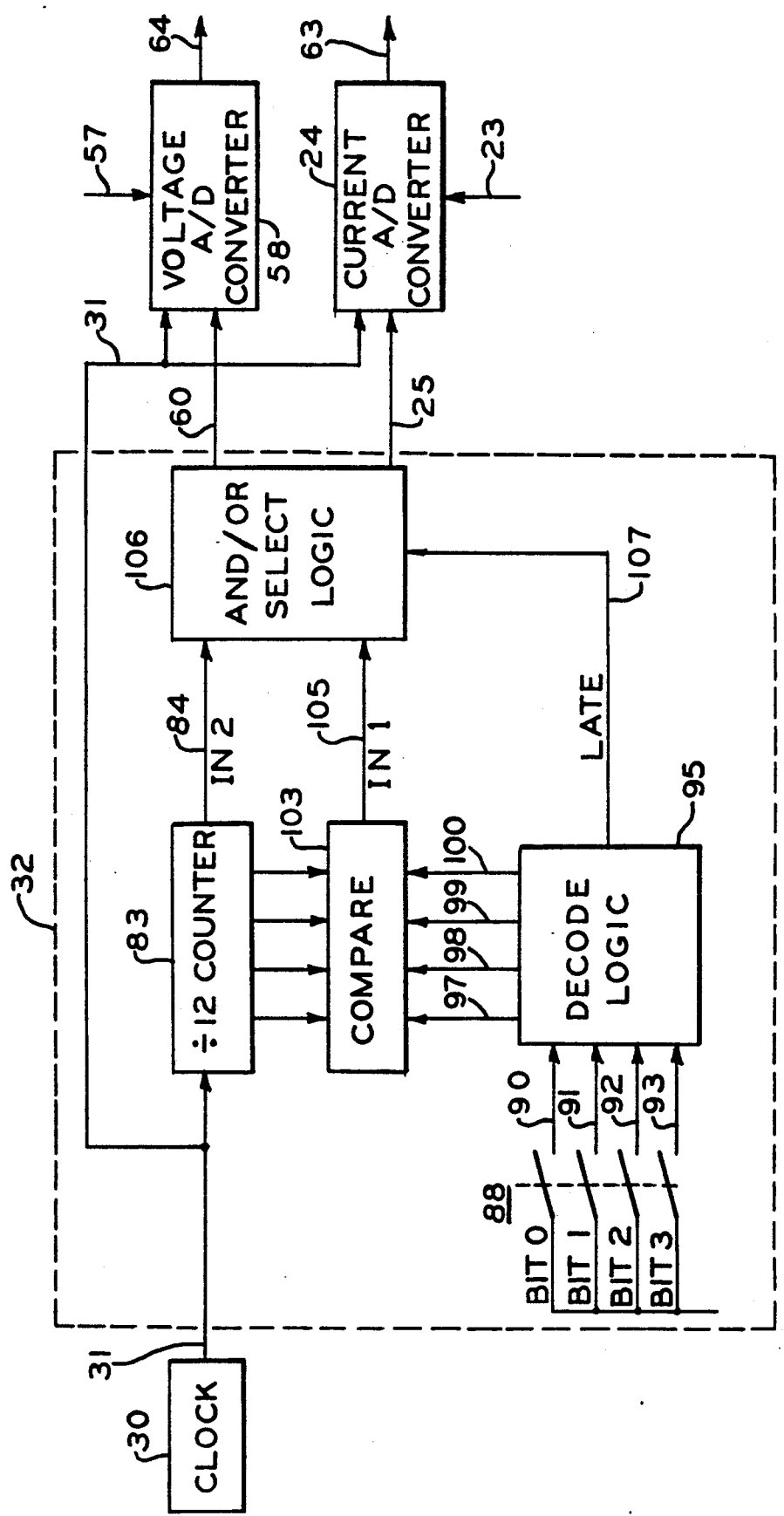
FIG_4

| DELAY, deg. | INPUT HEX CODE | BINARY CODE | STATUS |
|---|---|---|---|
| 11T | 5 | 0 1 0 1 | |
| 10T | 6 | 0 1 1 0 | |
| 9T | 7 | 0 1 1 1 | CURRENT SAMPLES |
| 8T | 8 | 1 0 0 0 | LAG |
| 7T | 9 | 1 0 0 1 | VOLTAGE SAMPLES |
| 6T | A | 1 0 1 0 | LATE = 0 |
| 5T | B | 1 0 1 1 | |
| 4T | C | 1 1 0 0 | |
| 3T | D | 1 1 0 1 | |
| 2T | E | 1 1 1 0 | |
| 1T | F | 1 1 1 1 | |
| 0 | 0 | 0 0 0 0 | NO DELAY |
| -1T | 1 | 0 0 0 1 | CURRENT SAMPLES |
| -2T | 2 | 0 0 1 0 | LEAD VOLTAGE |
| -3T | 3 | 0 0 1 1 | SAMPLES |
| -4T | 4 | 0 1 0 0 | LATE = 1 |
FIG_5
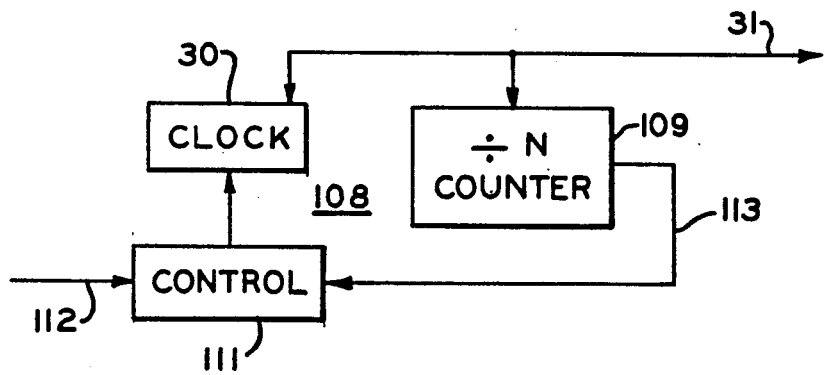
FIG_6

ELECTRONIC METER DIGITAL PHASE COMPENSATION

This is a continuation of copending application Ser. No. 07/279,178 filed on 12/2/88, now abandoned.

BACKGROUND OF THE INVENTION

The present invention relates to electronic power metering utilizing digital signal processing and, more particularly, to simplified means to improve the accuracy of such meters by compensating for undesired differences or errors in the phase of the voltage and current signals.

Electronic watthour meters are disclosed, for example, in U.S. Pat. No. 4,535,287 Milkovic; U.S. Pat. No. 4,556,843 Milkovic and Bogacki; U.S. Pat. No. 4,682,102 Milkovic; and U.S. Pat. No. 4,761,605 Jochum; all of which are assigned to the same assignee as the present invention. In the present invention, an electronic watthour meter converts the analog signals proportional to current and voltage in the circuit being metered to digital signals for digital signal processing. The current signals are first converted to voltage signals by a current to voltage converter for compatibility with the analog to digital converters which provide digital signals based on samples of the current and voltage input signals. The conversion of such signals to binary to binary form is based on the amplitude of the current and voltage signals. The digital signals can then be readily multiplied and the product of the multiplication is added to an accumulator which generates pulses proportional to the power use on the power lines being metered. The accuracy of such electronic watthour meters requires that the voltage and current signals be in the correct phase relationship before each is provided to its analog to digital converter. That is, the phase relationship should accurately represent that in the power lines. However, the voltage and current scaling and isolation is accomplished through circuitry including instrument transformers and other circuit elements which may introduce phase differences or errors between them.

In order to obtain the required accuracy, and to compensate for manufacturing tolerances, errors in the instrument transformers and changes in circuit elements with time and/or environmental exposure, it becomes necessary to provide phase adjusting or compensating means for the electronic watthour meter. However, it is important that such conpensating means be simple, inexpensive, stable, and reliable. Power meter users, such as power companies and electrical utilities are used to simple adjustment in present rotating element magnetic watthour meters which require tools no more complex than a screwdriver. The phase adjustment requires effectively compensating for, or shifting the phase of, the voltage signal from the secondary winding of the voltage transformer relative to the current signal from the current sensor the amount of their error phase difference. However, in three phase power meters there are separate current and voltage isolation and scaling transformers for each of the three phases. Conventional phase shifters utilizing a variable resistor and/or variable capacitor for each of the three phases would increase the material cost and complexity (and hence reduce reliability), and would require additional cost and complexity for a technician to perform each adjustment individually, particularly in the field when recalibration may be undertaken by a customer. Moreover, variable RC network phase shifting is not applicable to multiplexed signals in three phase electronic power meters.

OBJECTS AND SUMMARY OF INVENTION

It is an object of the present invention to provide a simplified phase adjustment for an electronic power meter;

It is another object of the present invention to provide a phase adjustment for an electronic power meter which requires but a single adjustment for multi-phase power circuits; and It is yet another object of the present invention to provide a phase adjustment for an electronic power meter which is inexpensive, reliable and stable.

In practicing the invention, an electronic solid state power meter is provided for polyphase power lines utilizing a current multiplexer to combine the signals from individual line currents in each phase, a voltage multiplexer to combine the individual line voltage signals for each phase, current and voltage analog to digital converters for converting each multiplexed signal to a digital signal, and a multiplier to multiply the digital signals as an indication of power use on the polyphase power lines. Phase shift compensation means are provided to adjust the time of the sampling of one multiplexed signal relative to the other to compensate for phase shifts in the system, and provide a more accurate indication of power use on the power lines. The phase shift compensation allows adjustment for either lead or lag phase error differences. The invention also has application in single phase power line systems, in which case multiplexing is not required.

BRIEF DESCRIPTION OF THE DRAWING

FIG. 1 is a block diagram of an electronic watthour meter in accordance with the present invention;

FIG. 2 is a plot of in-phase current and voltage signals; and

FIG. 3 is a plot of current and voltage signals illustrating a delayed current signal and phase compensation in accordance with the present invention;

FIG. 4 is a diagram of a phase shifting network in accordance with the present invention;

FIG. 5 is a table illustrating the effects of the binary code switching on the phase compensation; and FIG. 6 is a diagram of a phase locked loop arrangement useful in one embodiment of the present invention.

DESCRIPTION OF THE PREFERRED EMBODIMENT

Referring to FIG. 1, there is shown a three phase electronic watthour meter in which three current scaling and isolation means 1, 2 and 3 provide output current signals 4, 5, and 6 respectively, which are proportional to the line currents in power lines 11, 12 and 13 respectively. In order to obtain the desired scaling and isolation, the current scaling and isolation circuits 1, 2, and 3 include current transformers (not shown) which, with the proper turns ratio between the primary and secondary windings, in part provide the desired scaling. In addition, the transformers isolate the solid state circuitry of the electronic power meter from the power lines. The structure and operation of current scaling and isolation means 1, 2 and 3 are described in more detail in copending patent application Ser. No. 259,234, filed Oct. 18, 1988 by Donald F. Bullock, entitled "Current Sensors", and assigned to the same assignee as the present invention. Current scaling ratios of 100,000-to-one and 10,000-to-one have been selected for self-contained power meters with full scales of 200 amperes and 20 amperes (transformer rated) meters respectively. Full-scale secondary currents or output signals 4, 5 and 6 are then 2.0 milliamps root means square (rms). In order to minimize the complexity of the electronic circuitry, the scaled output current signals 4, 5 and 6 are provided to current multiplexer 15 where they are sequentially sampled to provide separate time separated sample signals which are proportional to each of the current signals 4, 5, and 6. The multiplexer enables the use of a single data processing channel (described below) for time-sharing all three of the multiplexed and hence time separated current signals 4, 5 and 6 as multiplexed current signal 16. Multiplexed current signal 16 is provided to the input of the current to voltage converter 17, which passes the multiplexed current signal 16 through a current to voltage converter 18 to generate a voltage signal 18 proportional to the multiplexed current signal 16 which is compatible with the analog to digital converter 24 to be described below. The scaling of the current to voltage converter 17 is one volt output signal 18 per one milliamp input signal 16. The voltage signal 18 is fed to the gain adjust circuit 19 which utilizes gain adjust control or potentiometer 20 to vary the gain of an operational amplifier (not shown) and provide the desired amplitude for signal 18 before the gain adjusted current analog signal 23 is fed to the current analog to digital converter or current A/D converter 24. The A/D converter 24 also receives the current or I clock signal 25 and voltage reference signal 26. The I clock signal 25 is a precision timing signal provided by a crystal controlled oscillator or clock 30 which is fed through a shift sample time circuit 32 which includes a phase adjustment means 33 and which is described in more detail below in connection with FIGS. 2, 3, 4 and 5. The voltage reference signal 26 is a stable precision voltage reference provided by a temperature-compensated zener diode in the precision voltage reference circuit 36 and which may be an integrated circuit of the type manufactured by National Semiconductor and identified as their type LM 129.

The phase 1 voltage 41, phase 2 voltage 42 and phase 3 voltage 43 are fed through the voltage scaling and isolation circuits or transformer circuits 44, 45 and 46, respectively, to provide voltage scaled and isolated signals 51, 52 and 53 respectively to the voltage multiplexer 56 which provides a voltage multiplexed analog signal 57 to the voltage analog to digital converter, or voltage A/D converter, 58. It is important that the voltage scaling and isolation circuits 44, 45, and 46 be matched such that their phase delay characteristics are equal. Similarly, it is important that the current scaling and isolation circuits 1, 2 and 3 be matched to one another such that their phase delay characteristics are also equal. The voltage A/D converter 58 also receives a voltage reference signal 26 from the precision voltage reference circuit 36 and the voltage clock or V clock signal 60 which is provided by shift sample time circuit 32. In the FIG. 1 embodiment both, A/D converters 24 and 58 have a full-scale range of approximately ±3.45 volts DC as determined by the voltage reference signal 26. The clock 30 provides precision time base clock signals 27 to control the functioning of the A/D converters 24 and 58 and the shifted time sample clock signals 25 and 60 are at a rate which is one twelfth of the frequency of clock signals 27 as described below in connection with FIG. 4. Signals 25 and 60 establish a constant sample rate at which the A/D converters 24 and 58 "sample" the current and voltage inputs 23 and 57 and convert their amplitudes to binary words. The current and voltage signals 23 and 57 are sampled every twelfth cycle of the clock signal 27. Sample rates in excess of several kilohertz are desired to obtain good performance for harmonics in the input signals 23 and 57. The current A/D converter 24 and the voltage A/D converter 58 provide output signals, namely a digital current signal 63 and a digital voltage signal 65, respectively, which are digital words representative of, and proportional to, their analog inputs, namely the gain adjusted current signal 23 and the voltage multiplexed signal 57, respectively. In the current and voltage A/D converters 24 and 58, upon application of the I clock or timing signal 25 and the V clock or timing signal 60 to the A/D converters respectively, the analog input signals 23 and 57, respectively, are sampled and held with their magnitudes converted into binary form with the voltage reference signal 26 defining the binary magnitudes of the current and voltage signals 23 and 57.

The digital current signal 63 and the digital voltage signal 64 are in the form of binary coded signals or words, such that digital logic or digital signal processing techniques can be used to accomplish the remainder of the metering function. The digital current signal 63 and the digital voltage signal 64 provide the inputs to the multiplier 65 which multiplies each binary coded current sample, with that of its corresponding voltage sample, to provide a digital input signal 68 to the accumulator 69, which input represents their produce and which is proportional to power. Samples of the line current 11 of line 1 at it is carried by the multiplexed current signal 16, and samples of phase voltage 41 of phase 1 as it is carried by the multiplexed voltage signal 57 of the power being measured in line 1 are thus multiplied; as are the current and voltage samples of lines 2 and 3. In the case of line 2, it is samples of the line current 12 and the voltage 42 which are multiplied, while in the case of line 3, it is samples of the line current 13 and the voltage 43 which are multiplied.

Each time the accumulated sum of the multiplied voltage and current samples or input 68 reaches a preset threshold value, proportional to the meter watthour constant, an output pulse is generated by the accumulator 69. In one embodiment of the present invention, the rate of output pulse 70 was selected to be twelve times the rate of one disk revolution for an equivalent electromechanical watthour meter. A typical threshold value is 144 $(10^{-6})$ volt-ampere-seconds for a one element meter for two-wire single phase applications, and 864 $(10^{-6})$ volt-ampere-seconds for three phase applications. The register 71 counts, stores and displays energy information based on the number of pulses 70 that it receives. The register 71, could include a digital display, such as a liquid crystal display (now shown), to display the line power consumption in kilowatt hours.

The accuracy of the energy reading provided by the register 71 is dependent on the current and voltage signals 63 and 64, which are derived form the analog current and voltage signals 23 and 57 respectively, being of the correct phase when multiplied in multiplier 65. Referring to FIG. 2, an ideal phase relationship is shown where the current signal 23 and voltage signal 57 are in phase. As such, no phase shift compensation is required. As a result the A/D conversions of the in phase current and voltage signals 23 and 57 are simultaneously carried out by converters 24 and 58 respectively. This simultaneous conversion is illustrated in FIG. 2 where the I clock 25 and the V clock 60 are coincident with the in phase components of signals 23 and 57. At the end of the two A/D conversions, the binary outputs 63 and 64 from converters 24 and 57 are thus, each true in phase representations of the in phase analog current and voltage signals 23 and 57 respectively. As a result, when the current signal 63 and voltage signal 64 are multiplied by multiplier 65 an accurate representation of the power consumed by power lines 11, 12 and 13 will be manifested in the binary digital signals 68 from the multiplier 65.

Referring to FIG. 3, it is to be now noted that the current signal 23 has suffered a phase delay in the current circuits, for example, in the current sensors of current scaling and isolation circuits 1, 2 and 3. While the delays encountered in actual use are somewhat exaggerated in FIG. 3, there is a time delay or td 74 such that if the I clock and V clock signals 25 and 60 were simultaneously generated (as in FIG. 2) the current signal 23 would be negative while the voltage signal 57 is positive, thus providing a multiplier output signal 68 which would not be an accurate representation of the real power in lines 11, 12 and 13. The shift sample time circuit 32 can be and is adjusted as described in more detail below in connection with FIGS. 4 and 5 such that the I clock 25 is delayed by the clock delay or td 75 an amount equal to the time delay 74 relative to the V clock 60 such that their timing is corrected relative to the phases of the current and voltage signals 23 and 57. Thus, the time shifted I clock signal 25 and the V clock signal 60 both begin to sample their respective signals, for example, at the instant when both the current signal 23 and voltage signal 57 start positive. In this manner, the sampling period is adjusted to begin at a precise point in time when the current and voltage signals 23 and 57 are in phase. The operation and details of the shift sample time circuit are best discussed with reference to FIGS. 4 and 5.

FIG. 4 shows the details of the digital phase adjustment circuitry. Referring to FIG. 4, the clock 30 provides a 414.6 kilohertz clock signal 31 to counter or divider 83 of shift sample time 32 which divides the signal 31 by twelve providing an output signal 84 which is approximately 34.5 kilohertz. The signal 84 drives the and/or select logic circuit 106 which provides the voltage clock signal 60 at approximately 34.5 kilohertz to the voltage analog to digital converter 58; and also provides a current clock signal 25 at approximately 34.5 kilohertz to the current analog to digital converter 24. The voltage clock signal 60 and the current clock signal 25 are control signals which control when the analog to digital converters 58 and 24 respectively, sample the multiplexed analog input signals, 57 and 23, respectively, and convert the magnitudes of the converter analog input signals 57 and 23 to binary coded outputs, 64 and 63 respectively. Basically, the voltage clock signal 60 and the current clock signal 25 determine the sampling rate, and each conversion process in analog to digital converters, 58 and 24 respectively, is clocked to completion within the twelve clock signal 60 and the current clock signal 25, respectively.

The phase or timing shift between the voltage clock signal 60 and the current clock signal 25 is set by shift sample time circuit 32. This timing shift is controlled by a phase shift control 88 which is preferably a sixteen position binary-coded switch such as that sold by EECO, Inc., as their model 330035GS. The four bit binary input shown as BIT 0, BIT 1, BIT 2, and BIT 3 provides a four bit signal via inputs 90, 91, 92 and 93 to the decode logic circuit 95. FIG. 5 shows the possible input states (in Hex code and Binary code) for BITS 0–3. FIG. 5 also shows the allocation of which states of BITS 0–3 provide prescribed degrees (given as TAU) of phase delay between the voltage and current clock signals 60 and 24. It should be noted that state 0 (Hex) provides no delay between clock signals 60 and 25, which means that these signals are coincidental in time or phase under that condition. The four bit output of the decode logic circuit 85 is provided to the compare or comparison circuit 103 via outputs 97, 98, 99 and 100. The decode logic circuit 95 decodes BITS 0–3 from the binary switch 88 inputs and provides decoded outputs as 97–100, representative of delay as shown in FIG. 5. That is, outputs 97, 98, 99 and 100 define how many steps or states from 0 (Hex) the phase separation (in degrees) should be. Decode logic 95 also decodes BITS 0–3 to develop a late signal 107 from the decodes shown in FIG. 5. The late signal 107 determines the direction of the phase correction or compensation (ie, whether the current signal 23 is leading or lagging the voltage signal 57). When the counter 83 reaches the state defined by 97, 98, 99 and 100, the output IN1 105 takes place from the compare 103. When the counter 83 reaches its full count, the output IN2 takes place. The output IN1 or clock signal 105 and the output IN2 or clock signal 84 are both approximately 34.5 kilohertz. The output signals 105 and 84 are the input signals to the and/or select logic circuit 106 which also receives the late signal 107. The late signal serves as a switching signal to cross switch the IN1 and IN2 signals at the outputs 25 and 60 of the and/or logic 106 to control the sampling start times of the converters 24 and 57. The two clock signals 84 and 105 are logically combined with the late signal 107 in the and/or select logic circuit 106. When the late signal 107 is equal to 1, the IN1 signal 105 controls the current or I clock signal 25, and the IN2 signal 84 controls the voltage or V clock signal 60. The V clock signal will be delayed as determined by BIT 0–3 switch settings as shown in FIG. 5. When the late signal 107 is equal to zero, the IN1 signal 105 is switched in logic 106 to control the voltage or V clock signal 60 and the IN2 signal 84 is switched to control the I clock 25. Thus, the sampling of the current signal 25 in converter 24 is delayed by the amount (in degrees) specified by the time of occurrence of the IN1 signal now applied to the voltage converter 57 (see FIG. 5 for Late=0).

The details of the time delay or phase shift provided by the shift sample time circuit 32 is explained in further detail in connection with FIG. 5.

Referring to FIG. 5, the table shows the binary codes for sixteen step, four bit hex-coded rotary switch 88. The zero or 0 delay provides for the situation when there is no delay between the analog input current and voltage signals 23 and 57 to converters 24 and 58 respectively. The 11 switch positions above the zero delay represent steps in situations where the current analog input 23 to the converter 24 lag the analog voltage signals 57 to the converter 58. The 4 switch positions below the 0 delay represent steps in situations where the input current 23 leads the input voltage 57. The rotary switch 88 is conveniently screwdriver actuated to provide delays between the clock timing signals 60 and 25 to the voltage A/D converters of approximately 0.052 degrees per step for a total adjustment range of approximately three-fourths of a degree. The small steps can be very precisely controlled discrete steps based on the frequency of the clock signal 31 from crystal controlled clock 30. It is to be noted that those four steps below the no delay point of FIG. 5 provide timing or clock signals in which the current timing or clock signal 25 precedes the voltage timing or clock signal 60. That is, the sampling of the input current, initiated by the current clock signal 25, leads the sampling of the input voltage initiated by the voltage clock signal 60. Thus, the rotary switch 88 enables a leading or lagging timing or phase adjustment to compensate for phase differences which otherwise would introduce errors into the metering. The phase adjustment, being screwdriver actuated can readily be accomplished during manufacture and also during any repair or recalibration undertaken by the customer's service personnel. Moreover, a single adjustment is all that is required to adjust the phases of a multiphase power meter.

The present invention thus provides an effective and simple adjustment to compensate for a number of situations which would otherwise introduce error into the power meter including manufacturing tolerances, changes of circuit parameters with time and/or environmental exposure, and to compensate for errors in other system components, such as the current transformers (not shown) included within the current scaling and isolation circuits 1, 2 and 3. In addition, adjustment may be made to conform to different test conditions, and/or with different reference standards. Also, a single screwdriver adjustment effectively compensates for phase errors in single phase meters as well as compensation of such errors in all three phases of polyphase meters.

Since the frequency of the power lines 11, 12 and 13 of most commercial power systems is very stable because clocks and other timing devices depend on such accuracies, it may not be necessary to provide compensation for variations in the power line frequency. In the present invention, matching the phase of the input signals to the analog to digital converters 24 and 58 is accomplished by shifting the sampling time of the voltage signal 57 relative to the current signal 23. When the power line frequency changes, the fixed amounts shown in FIG. 5 represent a different amount of phase shift. Worst case line frequency variations seldom exceed 0.02 per cent. This typically occurs during periods of low power usage such as nights or weekends when the electric utility is "catching up+ on cycles lost during high usage periods. American National Standards Institute (ANSI) standard C12.1 describes a line frequency variation test in which the frequency is varied plus and minus 5 per cent with a power factor 1.0. Even in the worst case test condition, the resultant variation in watthour meter calibration at a power factor of 1.0 is probably negligible. In the present invention, errors due to line frequency variations do not appear to justify the complexity involved in making the time delays vary with power line frequency variations. However, to the extent such increased accuracy is required, the phase compensation accomplished by the present invention can be made insensitive to line frequency variations by "slaving" the clock 30 to the line frequency through use of a phase locked loop.

FIG. 6 shows a phase locked loop circuit which may be used with the present invention if the additional accuracy is required or desired. A suitable phase-locked loop is disclosed in U.S. Pat. No. 4,682,102 Milkovic, assigned to the same assignee as the present invention. Referring to FIG. 6, the oscillator or clock 30 includes the phase locked loop 108. The phase locked loop 108 includes a counter or N divider 109 in series with control circuit 111. The analog line voltage 112 from the power lines is an input to the control circuit 111 along with the feedback signal 113. The dividing rate N of the divider 109 and the frequency of clock 30 are selected such that the frequency divided by the dividing rate N equals the frequency of the line voltage 112. That is clock frequency:counter rate N=power line frequency. The control circuit 111 compares the phases of the line voltage 112 and the feedback signal 113 and applies a control signal to clock 30 to effectively lock the frequency of the clock 30 to the desired multiple N of the power line frequency, making the frequency accuracy of the clock 30 equal to the frequency accuracy of the power line frequency 112. It is desirable that N be a large number, in the other of 7000 or more since it is desirable in a digital power meter that the number of output pulses per measurement by sufficiently high to avoid any jitter on the output pulse rate.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. In an electronic watthour meter for metering the consumption of electrical energy in polyphase power lines, the combination comprising:
    a first analog to digital converter for providing a first digital signal in response to current flow in each line of said power lines;
    a second analog to digital converter for providing a second digital signal in response to voltage applied to each of said power lines;
    a multiplier for multiplying said first digital signal and said second digital signal to derive an indication of electrical energy consumption on said power lines; and compensation means for providing a first timing signal to said first analog to digital converter and a second timing signal to said second analog to digital converter, said compensation means including phase shifting means for lead or lag phase errors by shifting the direction and amount of timing of said first timing signal relative to that of said second timing signal to provide said first and second digital signals to said multiplier substantially in time phase for all current and voltage phases of said polyphase power lines through use of a single adjustment.

2. In an electronic watthour meter for metering the consumption of electrical energy in polyphase power lines, the combination comprising:
    a first analog to digital converter for providing a first digital signal in response to current flow in each line of said power lines;
    a second analog to digital converter for providing a second digital signal in response to voltage applied to each of said power lines;
    a multiplier for multiplying said first digital signal and said second digital signal to derive an indication of electrical energy consumption on said power lines; and first compensation means for providing a first timing signal to said first analog to digital converter and a second timing signal to said second analog to digital converter, said first compensation means including phase shifting means for lead or lag phase errors by shifting the direction and amount of timing of said first timing signal relative to that of said second timing signal, to provide said first and second digital signals to said multiplier substantially in time phase for all current and voltage phases of said polyphase power lines through use of a single adjustment; and additional compensation means providing insensitivity of said electronic watthour meter to power line frequency variations; whereby phase compensation is provided for phase differences in the power line and in the watthour meter circuitry and additional compensation is provided for power line frequency variations.

3. The electronic watthour meter in accordance with claim 2 wherein said phase shifting means includes means for providing a fixed timing offset plus means for shifting the timing of one of said first and second timing signals to correspond with a shift in the phase of either one of said power line currents and voltages, and said additional compensation includes a phase locked loop.

4. The electronic watthour meter of claim 3 wherein said first compensation means further includes means for cross switching the timing signals provided to said analog to digital converters, and the frequency of said first and second timing signals are very high compared to the frequency on said power lines.

5. The electronic watthour of claim 4 wherein a current scaling and isolation circuit is adapted to be connected in circuit with each phase of said power lines; and a current multiplexer is provided to combine the outputs of each current scaling and isolation circuit for provision of a multiplexed analog current signal to said first analog to digital converter; and a voltage scaling and isolation circuit is adapted to be connected in circuit with each phase of said power lines; and a voltage multiplexer is provided to combine the outputs of each voltage scaling and isolation circuit for provision of a multiplexed analog voltage signal to second analog to digital converter.

6. The electronic watthour meter of claim 5 wherein a current to voltage converter converts said multiplexed analog current signal to a voltage signal proportional to the multiplexed analog current before said multiplexed analog current signal is applied to said first analog to digital converter.

7. The electronic watthour meter of claim 6 wherein an adjustable gain circuit is provided to adjust the amplitude of the proportional voltage signal prior to the application thereof to said first analog to digital converter.

8. The electronic watthour meter of claim 7 wherein a precision voltage reference source provides a voltage reference signal to said first analog to digital converter and to said second analog to digital converter.

9. The electronic watthour meter of claim 8 wherein said precision voltage reference source includes a zener diode.

10. The electronic watthour meter of claim 9 wherein said first and second timing signals are derived from an oscillator.

11. In an electronic watthour meter for metering the consumption of electrical energy in polyphase power lines the combination comprising:

means for providing a multiplexed current signal, in response to the current flow in each of the lines of said power lines; means for providing a multiplexed voltage signal, in response to the voltage applied to each of the lines of said power lines;

a multiplier for multiplying said multiplexed current signal and said multiplexed voltage signal to provide a signal proportional to electrical energy consumption in said polyphase power lines;

means for sampling said multiplexed current signal and said multiplexed voltage signal prior to the multiplication thereof by said multiplier;

means to compensate for phase difference errors between said multiplexed current signal and said multiplexed voltage signal by adjusting the timing of the sampling of said multiplexed current and voltage signals;

said means for sampling including a current analog to digital converter for converting said multiplexed current signal to a first digital signal prior to multiplication by said multiplier;

a voltage analog to digital converter for converting said multiplexed voltage signal to a second digital signal prior to multiplication by said multiplier;

said means to compensate including means for providing a separate timing signal to each of said first and second analog to digital converters;

means for adjusting the timing of one of said timing signals relative to the other of said timing signals;

said timing signals being derived from an oscillator;

said oscillator including a phase locked loop whereby the accuracy of said oscillator is made equal to the frequency accuracy of the frequency of said power lines; and the timing signal provided to said current analog to digital converter may be adjusted relative to the timing signal provided to said voltage analog to digital converter; and said means to compensate further includes means for cross switching the timing signals provided to said analog to digital converters.

12. The electronic watthour meter of claim 11 wherein said oscillating is a high frequency oscillator.

13. The electronic watthour meter of claim 12 wherein the adjustment of the timing signal provided to said current analog to digital converter is performed by a binary coded switch.

14. The electronic watthour meter of claim 13 wherein a fixed timing offset between said timing signals is provided, which timing offset may then be modified by adjustment of said binary coded switch.

15. The electronic watthour meter of claim 14 wherein said binary coded switch provides at least a 4-bit binary code.

16. The electronic watthour meter of claim 15 wherein the frequency of said oscillator is very high compared to the frequency on said power lines, and includes; means for providing high frequency pulses to each of said current and voltage analog to digital converters to provide high frequency sampling of the multiplexed current and voltage signals during the periods when the timing signals are provided to said current and voltage analog to digital converters.

17. The electronic watthour meter of claim 16 wherein said means to compensate includes means responsive to outputs from said binary coded switch to indicate whether said multiplexed current signal is leading or lagging said voltage multiplexed signal.

18. The electronic watthour meter of claim 17 wherein said binary coded switch may be actuated to change the timing of the sampling of said multiplexed current signal relative to said multiplexed voltage signal to compensate for the phase difference error therebetween.

19. The electric watthour meter of claim 11 wherein a fixed offset is provided to the timing of said timing signals and said means for adjusting the timing is binary coded to enable adjustment for both lead and lag phase differences.

20. The electronic watthour meter of claim 19 wherein a fixed offset is provided to the timing of one of said timing signals and said means for adjusting the timing is a binary coded switch to enable adjustment for both lead and lag phase difference.

21. The electronic watthour meter of claim 11 wherein the frequency of said oscillator is divided by counter circuit to provide said timing signals at a sub-multiple frequency of said oscillator, which sub-multiple frequency is much higher than the line frequency of said power lines.

22. The electronic watthour meter of claim 21 wherein a decoding logic circuit provides a signal to selectively control the application of said timing signals to said current and voltage analog to digit converters.

23. In an electronic watthour meter for metering the consumption of electrical energy in polyphase power lines the combination comprising:
   means for providing a multiplexed current signal, in response to the current flow in each of the lines of said power lines; means for providing a multiplexed voltage signal, in response to the voltage applied to each of the lines of said power lines;
   a multiplier for multiplying said multiplexed current signal and said multiplexed voltage signal to provide a signal proportional to electrical energy consumption in said polyphase power lines;
   means for sampling said multiplexed current signal and said multiplexed voltage signal prior to the multiplication thereof by said multiplier;
   means to compensate for phase difference errors between said multiplexed current signal and said multiplexed voltage signal by adjusting the timing of the sampling of said multiplexed current and voltage signals;
   said means for sampling including a current analog to digital converter for converting said multiplexed current signal to a first digital signal prior to multiplication by said multiplier;
   a voltage analog to digital converter for converting said multiplexed voltage signal to a second digital signal prior to multiplication by said multiplier;
   means to compensate including means for providing a separate timing signal to each of said first and second analog to digital converters;
   means for adjusting the timing of one of said timing signals relative to the other of said timing signals; same timing signals being derived from an oscillator;
   the frequency of said oscillator is divided by a counter circuit to provide said timing signals at a sub-multiple frequency of said oscillator, which sub-multiple frequency is much higher than the line frequency of said power lines; a decoding logic circuit provides a signal to selectively control the application of said timing signals to said current and voltage analog to digital converters; and
   the contents of a counter in said counter circuit are compared with the binary coded outputs from said decoding logic circuit to provide the amount of delay and direction of change of at least one of said timing signals to compensate for phase differences between the multiplexed current and voltage signals.

24. The electronic watthour meter of claim 22 wherein the frequency of said oscillator is in excess of 400 kilohertz and said counter circuit divides said oscillator frequency by 12.

25. The electronic watthour meter of claim 14 wherein the rate of said timing signals are equal at said fixed timing offset.

* * * * *